United States Patent
Paul et al.

(10) Patent No.: US 10,388,549 B2
(45) Date of Patent: Aug. 20, 2019

(54) ON-BOARD METROLOGY (OBM) DESIGN AND IMPLICATION IN PROCESS TOOL

(71) Applicant: Applied Materials, Inc., Santa Clara, CA (US)

(72) Inventors: Khokan C. Paul, Cupertino, CA (US); Jay D. Pinson, II, San Jose, CA (US); Juan Carlos Rocha-Alvarez, San Carlos, CA (US); Hari K. Ponnekanti, San Jose, CA (US); Rupankar Choudhury, Bangalore (IN); Shekhar Athani, Bangalore (IN); Sandeep Kumpala, Bangalore (IN); Hanish Kumar Panavalappil Kumarankutty, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 271 days.

(21) Appl. No.: 15/347,519

(22) Filed: Nov. 9, 2016

(65) Prior Publication Data
US 2017/0148654 A1    May 25, 2017

Related U.S. Application Data

(60) Provisional application No. 62/258,894, filed on Nov. 23, 2015.

(51) Int. Cl.
*H01L 21/67* (2006.01)
*H01L 21/673* (2006.01)
(Continued)

(52) U.S. Cl.
CPC ...... *H01L 21/67253* (2013.01); *G05B 19/041* (2013.01); *G05B 19/401* (2013.01);
(Continued)

(58) Field of Classification Search
CPC ............ H01L 21/67253; G05B 19/401
See application file for complete search history.

(56) References Cited

U.S. PATENT DOCUMENTS 5,311,286 A * 5/1994 Pike ............... G01B 11/303
250/237 G
7,177,019 B2 * 2/2007 Stanke ............ B24B 37/005
257/E21.53
(Continued)

FOREIGN PATENT DOCUMENTS

KR  10-2015-0116332  10/2015
TW     201528416 A   7/2015
TW     201535575 A   9/2015

OTHER PUBLICATIONS

International Search Report and Written Opinion of Related application PCT/US2016/059944 dated Nov. 1, 2016.
(Continued)

*Primary Examiner* — Moazzam Hossain
(74) *Attorney, Agent, or Firm* — Patterson + Sheridan LLP (57) ABSTRACT

Implementations of the present disclosure generally relate to an improved factory interface that is coupled to an on-board metrology housing configured for measuring film properties of a substrate. In one implementation, an apparatus comprises a factory interface, and a metrology housing removably coupled to the factory interface through a load port, the metrology housing comprises an on-board metrology assembly for measuring properties of a substrate to be transferred into the metrology housing.

14 Claims, 10 Drawing Sheets

(51) Int. Cl.
*H01L 21/687* (2006.01)
*G05B 19/04* (2006.01)
*G05B 19/401* (2006.01)
*H01L 21/677* (2006.01)

(52) U.S. Cl.
CPC .. *H01L 21/67196* (2013.01); *H01L 21/67201* (2013.01); *H01L 21/67207* (2013.01); *H01L 21/67389* (2013.01); *H01L 21/67724* (2013.01); *H01L 21/67775* (2013.01); *H01L 21/68707* (2013.01); *H01L 21/68764* (2013.01); *G05B 2219/31459* (2013.01); *G05B 2219/40066* (2013.01)

(56) References Cited

U.S. PATENT DOCUMENTS

| | | | |
|---|---|---|---|
| 7,359,767 B2 | 4/2008 | Rice et al. | |
| 7,566,900 B2 | 7/2009 | Le et al. | |
| 2002/0106972 A1 | 8/2002 | Lebel et al. | |
| 2003/0062578 A1 | 4/2003 | Dougan et al. | |
| 2008/0203314 A1 | 8/2008 | Harrison et al. | |
| 2010/0133255 A1* | 6/2010 | Bahng | H01L 21/02071 219/444.1 |
| 2010/0173495 A1 | 7/2010 | Thakur et al. | |
| 2010/0185314 A1* | 7/2010 | Xu | B24B 37/005 700/109 |
| 2012/0079982 A1 | 4/2012 | Lubomirsky et al. | |
| 2012/0257952 A1* | 10/2012 | Palm | H01L 21/67775 414/752.1 |
| 2012/0258391 A1* | 10/2012 | Imaoka | G03F 9/7015 430/30 |
| 2014/0078495 A1* | 3/2014 | Zhang | H01L 22/12 356/72 |
| 2014/0118751 A1 | 5/2014 | Rajagopalan et al. | |
| 2014/0295053 A1* | 10/2014 | Felts | C23C 16/045 427/2.11 |
| 2016/0041478 A1* | 2/2016 | Mulkens | G03F 7/70616 355/67 |

OTHER PUBLICATIONS

Taiwan Application No. 105135825, Office Action and Search Report dated Mar. 29, 2019, 8 pages.

\* cited by examiner

FIG. 6C ed to the second side of the factory interface through a second load port, the metrology housing comprises an on-board metrology assembly for measuring film properties of a substrate to be transferred into the metrology housing by the atmospheric robot.

ON-BOARD METROLOGY (OBM) DESIGN AND IMPLICATION IN PROCESS TOOL

CROSS-REFERENCE TO RELATED APPLICATIONS

This application claims priority to U.S. provisional patent application Ser. No. 62/258,894, filed Nov. 23, 2015, which is herein incorporated by reference.

FIELD

Implementations of the present disclosure generally relate to an improved factory interface in a processing tool.

BACKGROUND

Plasma processing, such as plasma enhanced chemical vapor deposition (PECVD), is used to deposit materials, such as blanket dielectric films on substrates. In the PECVD film process, there has been two aspects that impact overall throughput: 1) Long chamber downtime after planned maintenance because iterative process tuning, using standalone metrology, takes a long time (typically over 18 hours); and 2) Tendency of film-thickness drift with time that requires monitoring and tuning the process on a regular basis. Thus, when using external standalone metrology, the tuning process is time consuming and reduces the production time. In order to increase production time, a procedure for reliable, accurate and sustainable metrology integrated with the tool is needed.

SUMMARY

Implementations of the present disclosure generally relate to an improved factory interface that is coupled to an on-board metrology housing configured for measuring film properties of a substrate. In one implementation, an apparatus comprises a factory interface, and a metrology housing removably coupled to the factory interface through a load port, the metrology housing comprises an on-board metrology assembly for measuring properties of a substrate to be transferred into the metrology housing.

In another implementation, the apparatus includes a factory interface, a first storage pod coupled to a first side of the factory interface through a first load port, and the first storage pod comprises one or more substrate carriers, a metrology housing removably coupled to the first side of the factory interface through a second load port, the metrology housing comprises an on-board metrology assembly for measuring film properties of a substrate to be transferred into the metrology housing, and a load lock chamber coupled to a second side of the factory interface and operating at vacuum environment, wherein the factory interface has a robot configured to provide access to the metrology housing and the load lock chamber.

In yet another implementation, a processing tool is provided. The processing tool includes a transfer chamber having a robotic arm, a factory interface having an atmospheric robot, a batch curing chamber coupled to the factory interface, a load lock chamber having a first side coupling to the transfer chamber and a second side coupling to a first side of the factory interface, the load lock chamber is configured to receive one or more substrates from the atmospheric robot, a flowable CVD deposition chamber coupled to the transfer chamber, a first storage pod coupled to a second side of the factory interface through a first load port, and the first storage pod comprises one or more substrate carriers, and an metrology housing coupled to the second side of the factory interface through a second load port, the metrology housing comprises an on-board metrology assembly for measuring film properties of a substrate to be transferred into the metrology housing by the atmospheric robot.

BRIEF DESCRIPTION OF THE DRAWINGS

Implementations of the present disclosure, briefly summarized above and discussed in greater detail below, can be understood by reference to the illustrative implementations of the disclosure depicted in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. The figures are not drawn to scale and may be simplified for clarity. It is contemplated that elements and features of one implementation may be beneficially incorporated in other implementations without further recitation.

DETAILED DESCRIPTION

Implementations of the present disclosure generally relate to an improved factory interface that has an on-board metrology housing coupled to a wall of the factory interface. The on-board metrology housing has a metrology assembly configured to measure film properties of a substrate. The factory interface has at least one atmospheric robot configured to transfer substrates either between the on-board metrology housing and a batch curing chamber coupled to the factory interface, or between the on-board metrology housing and a front opening unified pod (FOUR) coupled to the factory interface.

Processing Tool

Figure 1:
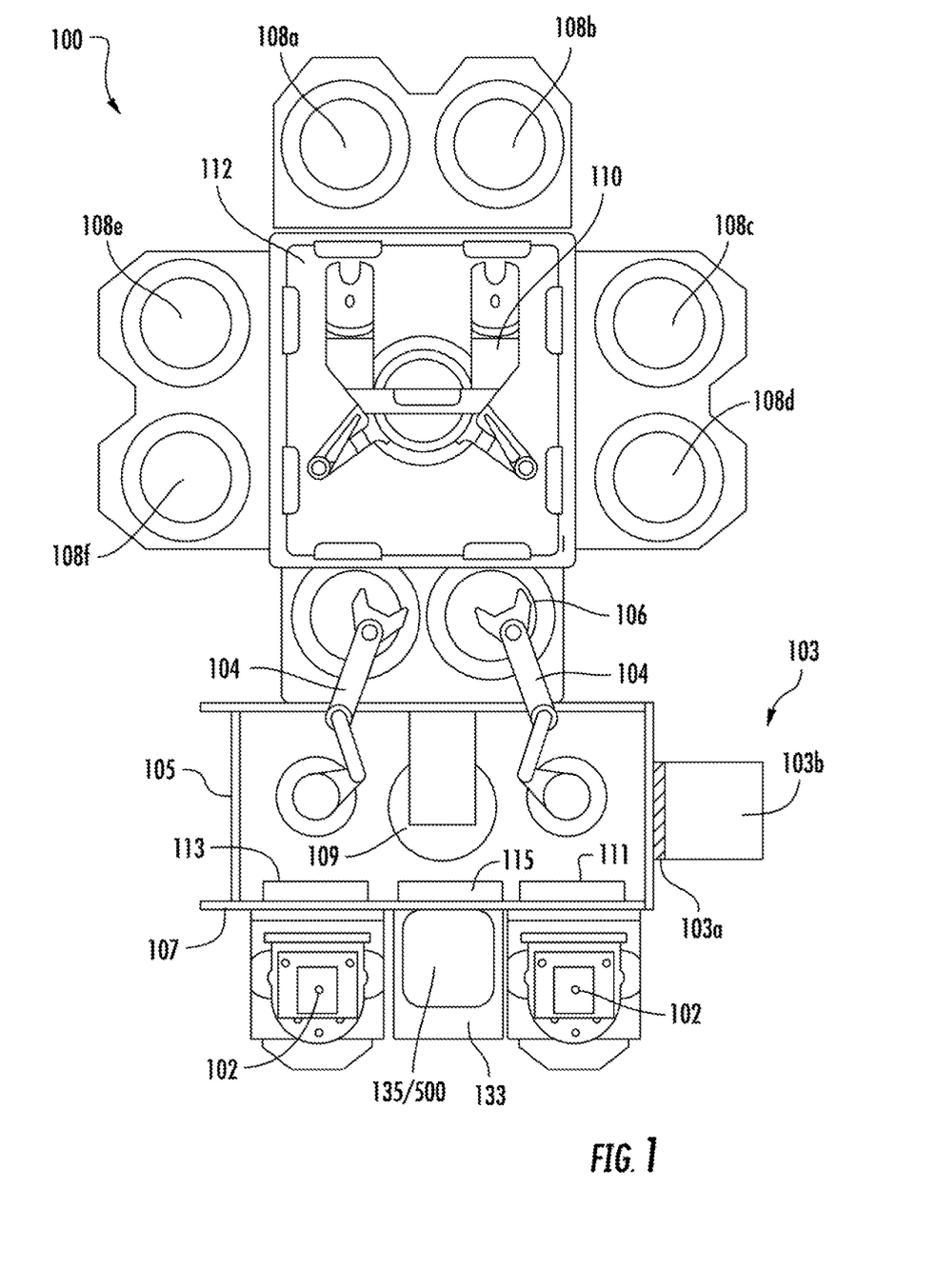
FIG. 1 illustrates a top plan view of an exemplary processing tool that may be used to process a semiconductor substrate according to implementations of the present disclosure.

FIG. 1 illustrates a top plan view of an exemplary processing tool 100 that may be used to process a semiconductor substrate according to implementations of the present disclosure. The processing tool 100 generally includes a factory interface 105, a batch curing chamber 103, a transfer chamber 112, an atmospheric holding station 109, and a plurality of twin processing chambers 108a-b, 108c-d and 108e-f. The factory interface 105 is operating at atmospheric pressure for storing and holding substrates. The factory interface 105 includes at least one atmospheric robot 104, such as a dual blade atmospheric robot, and is configured to receive one or more cassettes of substrates. On a first side of the factory interface 105, one or more load ports may be provided. In one exemplary implementation, three load ports are provided. For clarity, only two load ports 111, 113 are depicted in the implementation of FIG. 1. The load port 111, 113 is adapted to receive from a front opening unified pod ("FOUR") 102 a substrate (e.g., 300 mm diameter wafers) which is to be processed. The FOUR 102 has one or more substrate carriers configured to temporarily and portably storing the substrates. A load lock chamber 106 is coupled to a second side (opposing to the first side) of the factory interface 105. The load lock chamber 106 is coupled to the transfer chamber 112 in which the plurality of twin processing chambers 108a-b, 108c-d and 108e-f are located.

The substrate is transferred by the atmospheric robot 104 from the FOUPs 102 to the load lock chamber 106. A second robotic arm 110 is disposed in the transfer chamber 112 coupled to the load lock chambers 106 to transport the substrates from the load lock chambers 106 to processing chambers 108a-108f coupled to the transfer chamber 112. The factory interface 105 therefore provides a transition between the atmospheric environment of the factory interface and the vacuum environment of the tool or processing chambers.

The processing chambers 108a-108f may be any type of processing chambers, for example, chemical vapor deposition (CVD) chambers, atomic layer deposition (ALD) chambers, physical vapor deposition (PVD) chambers, ion metal implant (IMP) chambers, plasma etching chambers, annealing chambers, other furnace chambers, etc. In one implementation, the processing chambers 108a-108f are configured for depositing, annealing, curing and/or etching a flowable dielectric film on a substrate. In one configuration, three pairs of the processing chambers (e.g., 108a-108b, 108c-108d and 108e-108f) may be used to deposit the flowable dielectric material on the substrate. If desired, any of these processing chambers 108a-b, 108c-d and 108e-f, or one or more additional processing chambers may be coupled to the transfer chamber 112 and arranged to perform other conventional semiconductor device fabrication process such as oxidation, film deposition, etching, heating, degassing, ashing, ion implanting, metrology, etc. upon application.

In some implementations, the batch curing chamber 103 is configured to perform a batch curing process on multiple substrates simultaneously that have the flowable dielectric material deposited thereon. In such implementations, the batch curing chamber 103 is generally configured to perform a curing process on the number of substrates that can simultaneously undergo film deposition in the twin processing chambers 108a-108b, 108c-108d and 108e-108f. Thus, in the configuration illustrated in FIG. 1, the batch curing chamber 103 is advantageously sized to accommodate six substrates at one time during the curing process. Consequently, all substrates that have been processed by the twin processing chambers 108a-108b, 108c-108d and 108e-108f can undergo the curing processing simultaneously, thereby maximizing substrate throughput of the processing tool 100.

Furthermore, in cases where multiple processing chambers have different processing recipe start and end times, to prevent substrates from remaining in the batch curing chamber 103 for significantly different amounts of time, the processing tool 100 may include the atmospheric holding station 109 that is used to hold the already processed substrates until the other subsequently processed substrates are finished with their deposition processing. The atmospheric holding station serves as a buffer station that allows all of the substrates to be placed in the batch curing chamber 103 at once. For example, the atmospheric holding station 109 is configured to temporarily store substrates outside the batch curing chamber 103 until a desired number of substrates are available for processing in the batch curing chamber 103. The atmospheric robot 104 then loads the substrates into the batch curing chamber 103 in quick succession, so that no film-deposited substrate remains in the relatively high temperature batch curing chamber 103 for more than a few seconds longer than any other film-deposited substrate. Consequently, substrate-to-substrate variation in the curing process can be minimized or reduced.

The batch curing chamber 103 may include a chamber body 103B and slit valve 103A. The slit valve 103A is used to seal-off an internal region of the chamber body 103B after substrates have been positioned therein by the atmospheric robots 104.

In various implementations of the present disclosure, the factory interface 105 has an on-board metrology housing 133 coupled to the substrate existing side of the wall 107 adjacent to the FOUPs 102. In one implementation as shown, the on-board metrology housing 133 is disposed between the pair of FOUPs 102. While two FOUPs 102 are shown, it is contemplated that three or more FOUPs may be used to correspond the load ports (such as load ports 111, 113). In one example, three FOUPs are used, in which an additional FOUP is disposed next to either side of the FOUP 102. The on-board metrology housing 133 has an on-board metrology assembly 135 configured to measure film properties, such as film thickness, film composition, sheet resistance, particle count, and film stress, before and/or after processing of the substrate. In one implementation, the on-board metrology assembly 135 is configured to measure the film thickness of the substrate. The substrate to be measured may be transferred from the load lock chambers 106 or any of the FOUPs 102 to the on-board metrology housing 133 by the atmospheric robots 104 through a load port 115 (disposed on the substrate receiving side of the factory interface). Unlike the conventional systems where the metrology assembly is provided at the transfer chamber 112, the load lock chambers 106, the twin processing chambers 108a-b, 108c-d and 108e-f, or in a separate metrology chamber (not shown) coupled to the transfer chamber 112, the factory interface 105 that is capable of measuring thickness of films significantly shorter chamber downtime after planned maintenance as the thickness can be measured immediately after the process and can be used for process tuning through feedback control. In addition, having the on-board metrology assembly 135 integrated onto the factory interface 105 provides easy access for installation and/or servicing of the metrology assembly if needed. Exemplary of the on-board metrology assembly 135 and its structural relationship are further described with reference to FIGS. 4-6 below.

Flowable CVD Chamber and Deposition Process Examples

Figure 2:
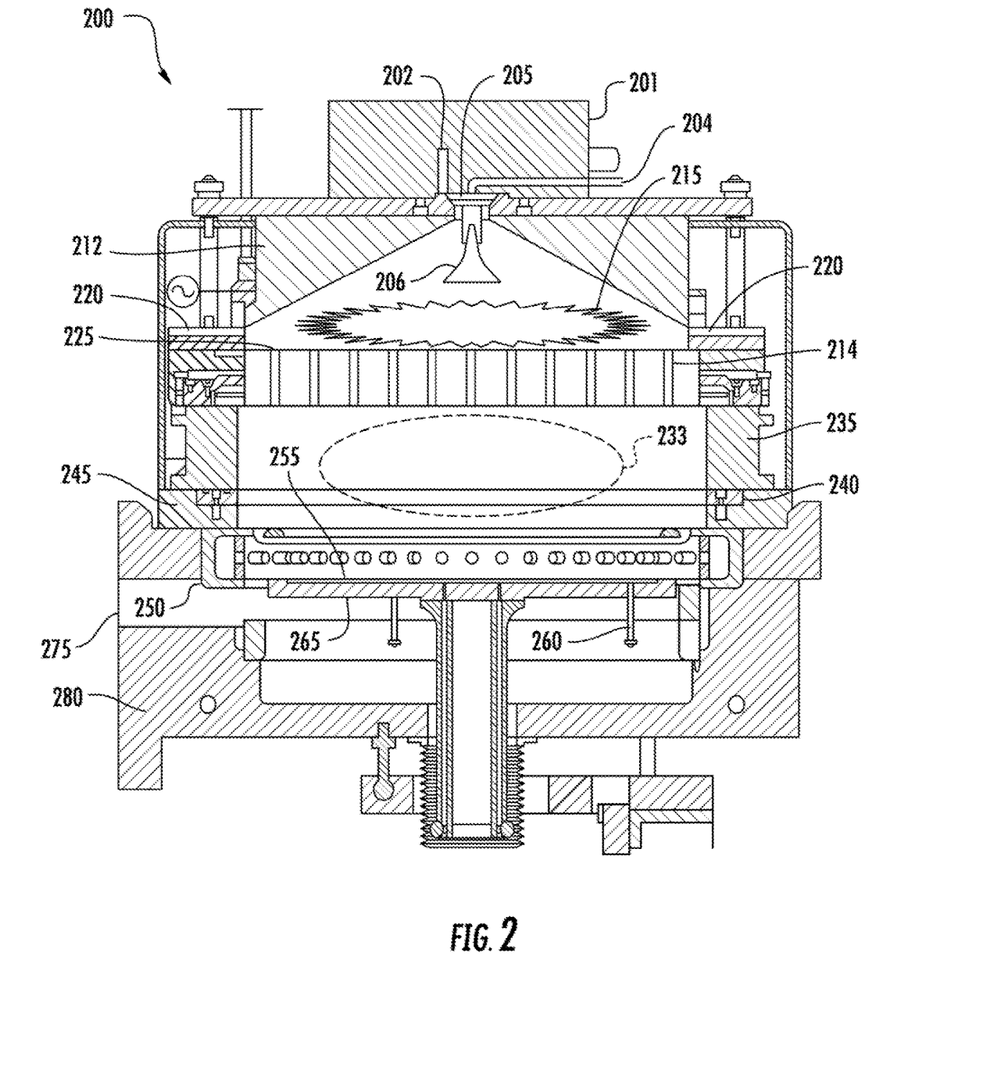
FIG. 2 is a cross-sectional view of one implementation of a flowable chemical vapor deposition chamber with partitioned plasma generation regions.

FIG. 2 is a cross-sectional view of one implementation of a flowable chemical vapor deposition chamber 200 with partitioned plasma generation regions. The process chamber 200 may be any of the processing chambers 108a-f of processing tool 100 that are configured at least for depositing a flowable dielectric material on a substrate. In some implementations, rather than process chamber 200, processing tool 100 may include any other suitable chemical vapor deposition chamber.

During film deposition (e.g., silicon oxide, silicon nitride, silicon oxynitride or silicon oxycarbide deposition), a process gas may be flowed into a first plasma region 215 through a gas inlet assembly 205. The process gas may be excited prior to entering the first plasma region 215 within a remote plasma system (RPS) 201. The process chamber 200 includes a lid 212 and showerhead 225. The lid 212 is depicted with an applied AC voltage source and the showerhead 225 is grounded, consistent with plasma generation in the first plasma region 215. An insulating ring 220 is positioned between the lid 212 and the showerhead 225, enabling a capacitively coupled plasma (CCP) to be formed in the first plasma region 215. The lid 212 and showerhead 225 are shown with an insulating ring 220 therebetween, which allows an AC potential to be applied to the lid 212 relative to the showerhead 225.

The lid 212 may be a dual-source lid for use with a processing chamber. Two distinct gas supply channels are visible within the gas inlet assembly 205. A first channel 202 carries a gas that passes through the remote plasma system (RPS) 201, while a second channel 204 bypasses the RPS 201. The first channel 202 may be used for the process gas and the second channel 204 may be used for a treatment gas. The gases that flow into the first plasma region 215 may be dispersed by a baffle 206.

A fluid, such as a precursor, may be flowed into a second plasma region 233 of the process chamber 200 through the showerhead 225. Excited species derived from the precursor in the first plasma region 215 travel through apertures 214 in the showerhead 225 and react with the precursor flowing into the second plasma region 233 from the showerhead 225. Little or no plasma is present in the second plasma region 233. Excited derivatives of the precursor combine in the second plasma region 233 to form a flowable dielectric material on the substrate. As the dielectric material grows, more recently added material possesses a higher mobility than underlying material. Mobility decreases as organic content is reduced by evaporation. Gaps may be filled by the flowable dielectric material using this technique without leaving traditional densities of organic content within the dielectric material after deposition is completed.

Exciting the precursor in the first plasma region 215 alone or in combination with the remote plasma system (RPS) 201 provides several benefits. The concentration of the excited species derived from the precursor may be increased within the second plasma region 233 due to the plasma in the first plasma region 215. This increase may result from the location of the plasma in the first plasma region 215. The second plasma region 233 is located closer to the first plasma region 215 than the remote plasma system (RPS) 201, leaving less time for the excited species to leave excited states through collisions with other gas molecules, walls of the chamber and surfaces of the showerhead.

The uniformity of the concentration of the excited species derived from the precursor may also be increased within the second plasma region 233. This may result from the shape of the first plasma region 215, which is more similar to the shape of the second plasma region 233. Excited species created in the remote plasma system (RPS) 201 travel greater distances in order to pass through apertures 214 near the edges of the showerhead 225 relative to species that pass through apertures 214 near the center of the showerhead 225. The greater distance results in a reduced excitation of the excited species and, for example, may result in a slower growth rate near the edge of a substrate. Exciting the precursor in the first plasma region 215 mitigates this variation.

In addition to the precursors, there may be other gases introduced at varied times for varied purposes. A treatment gas may be introduced to remove unwanted species from the chamber walls, the substrate, the deposited film and/or the film during deposition. The treatment gas may comprise at least one of the gases from the group comprising of $H_2$, an $H_2/N_2$ mixture, $NH_3$, $NH_4OH$, $O_3$, $O_2$, $H_2O_2$ and water vapor. A treatment gas may be excited in a plasma and then used to reduce or remove a residual organic content from the deposited film. In other implementations, the treatment gas may be used without a plasma. When the treatment gas includes water vapor, the delivery may be achieved using a mass flow meter (MFM) and injection valve or by other suitable water vapor generators.

In one implementation, the dielectric layer can be deposited by introducing dielectric material precursors, e.g., a silicon containing precursor, and reacting processing precursors in the second plasma region 233. Examples of dielectric material precursors are silicon-containing precursors including silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxyl-disiloxane (TMDDSO), dimethyl-dimethoxyl-silane (DMDMS) or combinations thereof. Additional precursors for the deposition of silicon nitride include SixNyHz-containing precursors, such as silyl-amine and its derivatives including trisilylamine (TSA) and disilylamine (DSA), SixNyHzOzz-containing precursors, SixNyHzClzz-containing precursors, or combinations thereof.

Processing precursors include hydrogen-containing compounds, oxygen-containing compounds, nitrogen-containing compounds, or combinations thereof. Examples of suitable processing precursors include one or more of compounds selected from the group comprising of $H_2$, a $H_2/N_2$ mixture, $NH_3$, $NH_4OH$, $O_3$, $O_2$, $H_2O_2$, $N_2$, $N_xH_y$ compounds including $N_2H_4$ vapor, NO, $N_2O$, $NO_2$, water vapor, or combinations thereof. The processing precursors may be plasma exited, such as in the RPS unit, to include N* and/or H* and/or O*-containing radicals or plasma, for example, $NH_3$, $NH_2$*, NH*, N*, H*, O*, N*O*, or combinations thereof. The process precursors may alternatively, include one or more of the precursors described herein.

The processing precursors may be plasma excited in the first plasma region 215 to produce process gas plasma and radicals including N* and/or H* and/or O* containing radicals or plasma, for example, $NH_3$, $NH_2*$, $NH*$, $N*$, $H*$, $O*$, $N*O*$, or combinations thereof. Alternatively, the processing precursors may already be in a plasma state after passing through a remote plasma system prior to introduction to the first plasma region 215.

The excited processing precursor 290 is then delivered to the second plasma region 233 for reaction with the precursors though apertures 214. Once in the processing volume, the processing precursor may mix and react to deposit the dielectric materials.

In one implementation, the flowable CVD process performed in the process chamber 200 may deposit the dielectric materials as a polysilazanes based silicon containing film (PSZ-like film), which may be reflowable and fillable within trenches, features, vias, or other apertures defined in a substrate where the polysilazanes based silicon containing film is deposited.

In addition to the dielectric material precursors and processing precursors, there may be other gases introduced at varied times for varied purposes. A treatment gas may be introduced to remove unwanted species from the chamber walls, the substrate, the deposited film and/or the film during deposition, such as hydrogen, carbon, and fluorine. A processing precursor and/or treatment gas may comprise at least one of the gases from the group comprising $H_2$, a $H_2/N_2$ mixture, $NH_3$, $NH_4OH$, $O_3$, $O_2$, $H_2O_2$, $N_2$, $N_2H_4$ vapor, NO, $N_2O$, $NO_2$, water vapor, or combinations thereof. A treatment gas may be excited in a plasma and then used to reduce or remove a residual organic content from the deposited film. In other implementations the treatment gas may be used without a plasma. The treatment gas may be introduced from into the first processing region, either through the RPS unit or bypassing the RPS unit, and may further be excited in the first plasma region.

Silicon nitrides materials include silicon nitride, $SixNy$, hydrogen-containing silicon nitrides, $SixNyHz$, silicon oxynitrides, including hydrogen-containing silicon oxynitrides, $SixNyHzOzz$, and halogen-containing silicon nitrides, including chlorinated silicon nitrides, $SixNyHzClzz$. The deposited dielectric material may then be converted to a silicon oxide like material.

Processing Sequence Example

Figure 3:
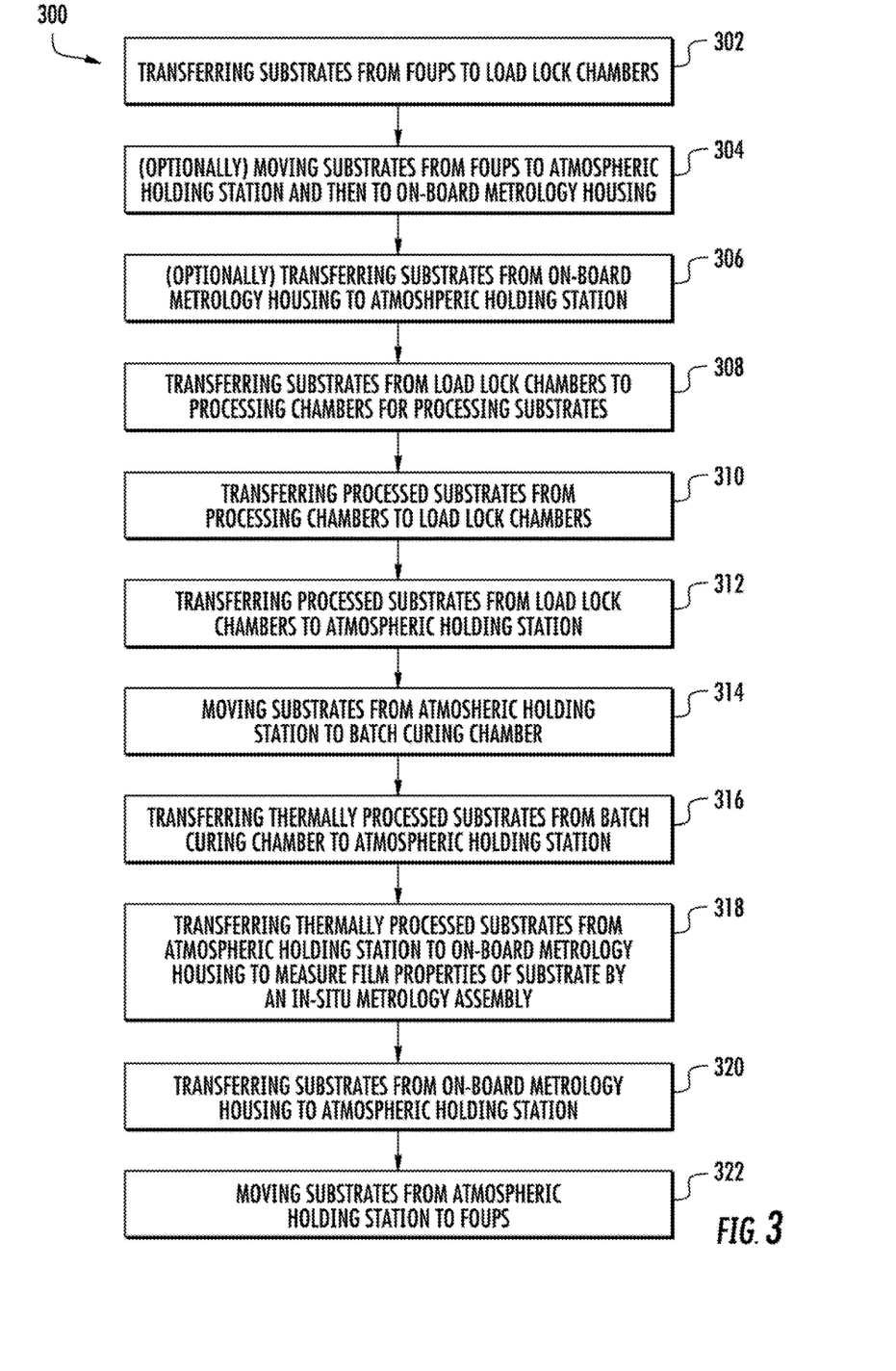
FIG. 3 illustrates a flow diagram of one implementation of a process 300 that may be performed in the processing tool.

FIG. 3 is a flow diagram of one implementation of a process 300 that may be performed in the processing tool 100. The process starts at block 302 where one or more substrates are transferred from the pair of FOUPs 102 to the load lock chambers 106 by the arms of an atmospheric robot 104.

At block 304, in some implementations where pre-calibration on substrate is needed (for example to perform bare silicon substrate calibration), before the substrates are transferred from the FOUPs 102 to the load lock chambers 106, the atmospheric robot 104 may optionally move the substrates from the FOUPs 102 to the atmospheric holding station 109 and then to the on-board metrology housing 133 so that the film properties, such as film thickness before any particular fabrication process(es) is rendered on the substrate, are obtained. Once the desired film properties are obtained, the substrates may be transferred from the on-board metrology housing 133 to the load lock chambers 106 by the arms of an atmospheric robot 104.

At block 306, once all the substrates or a desired number of substrates are done with the measurement, the substrates are transferred by the atmospheric robot 104 from the on-board metrology housing 133 to the atmospheric holding station 109.

The substrate may be a silicon substrate having a layer or layers formed thereon utilized to form a structure, such as a shallow trench isolation (STI) structure. In one implementation, the substrate is a silicon substrate having multiple layers, e.g., a film stack, utilized to form different patterns and/or features. The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate may be any of various shapes and dimensions, such as 200 mm, 300 mm or 450 mm diameter wafers, or rectangular or square panels.

At block 308, the robotic arm 110 of the transfer chamber 112 optionally transfers the one or more substrates from the load lock chambers 106 to the processing chambers 108a-108f for processing the substrates, such as the flowable CVD process as described above with respect to FIG. 2. In one implementation, the substrate is transported to a deposition process chamber, such as the flowable chemical vapor deposition (CVD) chamber 200 depicted in FIG. 2.

At block 310, once the substrates have been processed in the processing chambers 108a-108f, the robotic arm 110 transfers the processed substrates from the processing chambers 108a-108f to the load lock chambers 106.

At block 312, the atmospheric robot 104 transfers the processed substrates from the load lock chambers 106 to the atmospheric holding station 109 until the other subsequently processed substrates are finished with their deposition processing, or until a desired number of substrates are available for processing in the batch curing chamber 103. In one example, the processed substrates are cooled and held in the atmospheric holding station 109 for about 40 seconds to about 120 seconds, for example about 60 seconds.

At block 314, the atmospheric robot 104 moves the substrates from the atmospheric holding station 109 to the batch curing chamber 103, so that no film-deposited substrate remains in the relatively high temperature batch curing chamber 103 for more than a few seconds longer than any other film-deposited substrate.

In cases where the substrate is deposited with a dielectric material by the flowable chemical vapor deposition process, the batch curing chamber 103 can cure and/or thermally process the substrate to effectively remove moisture and other volatile components from the deposited dielectric material to form a solid phase dielectric material. As a result, a film formed via a flowable CVD process can be converted to a dense, solid dielectric film with little or no voids, even when formed on a substrate with high aspect ratio features.

At block 316, the cured or thermally processed substrates are transferred by the atmospheric robot 104 from the batch curing chamber 103 to the atmospheric holding station 109 to cool the substrates. In one example, the cured or thermally processed substrates are held in the atmospheric holding station 109 for about 40 seconds to about 120 seconds, for example about 60 seconds.

At block 318, the cured or thermally processed substrates are transferred by the arms of an atmospheric robot 104 from the atmospheric holding station 109 to the on-board metrology housing 133 coupled to the factory interface 105. The on-board metrology assembly 135/500 in the on-board metrology housing 133 then measures the film properties, such as film thickness of the substrate.

At block 320, once all the substrates or a desired number of substrates are done with the measurement, the substrates are transferred by the atmospheric robot 104 from the on-board metrology housing 133 to the atmospheric holding station 109.

At block 322, the atmospheric robot 104 moves the substrates from the atmospheric holding station 109 to the load port of the pair of FOUPs 102. The operations recited in blocks 302 to 322 may be repeated until all the substrates in the FOUPs 102, or a desired number of substrates in the FOUPs 102 are processed.

On-Board Metrology Assembly

Figure 4A:
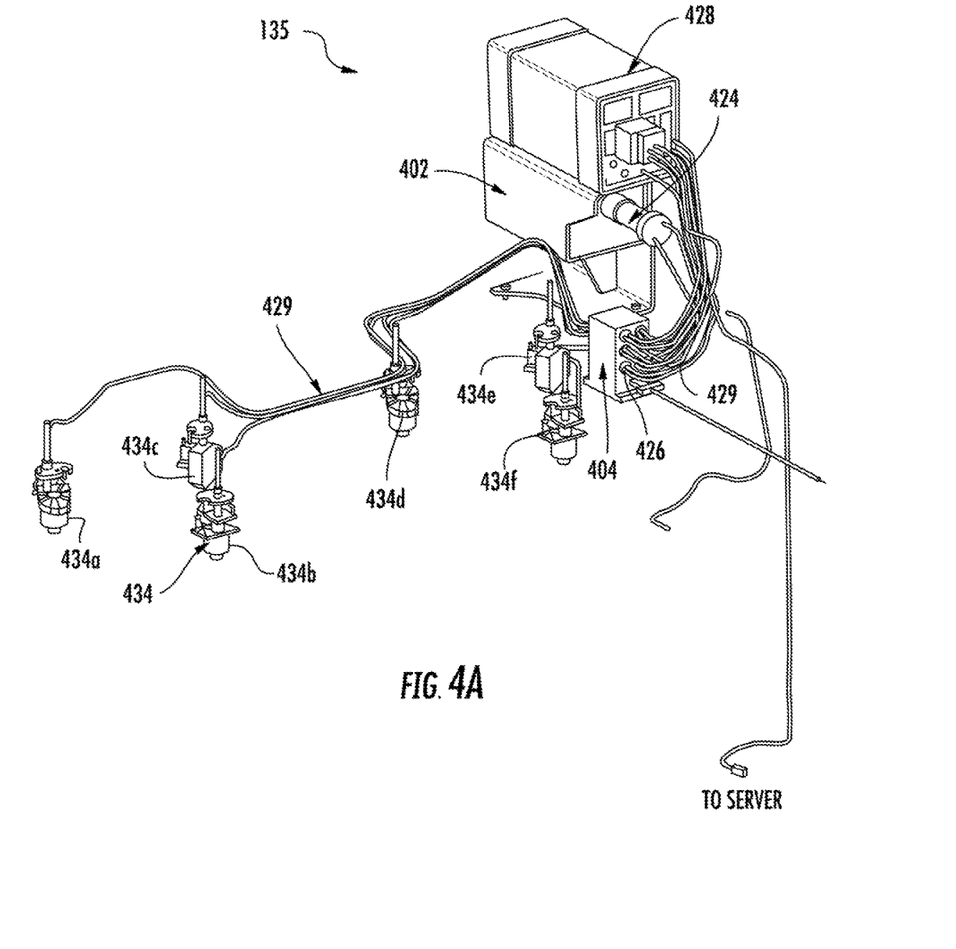
FIG. 4A illustrates the in-situ metrology assembly in simplified version according to implementations described herein.

FIG. 4A illustrates the in-situ metrology assembly in simplified version according to implementations described herein. The on-board metrology assembly 135 is a re-engineered design with similar working principles. For simplicity, the in-situ metrology model is used to describe the general aspects of the metrology hardware. The on-board metrology assembly 135 generally includes a light source 424, fiber-optic bundles 426 and a spectrograph 428. The on-board metrology assembly 135 also includes an aligner module 500, as will be discussed below in FIGS. 5A and 5B.

The light source 424 and the spectrograph 428 are secured by a supporting frame 402. The supporting frame 402 is supported by a mounting bracket 450 (shown in FIG. 4B) that may be directly or indirectly coupled to a wall 107 (shown in FIG. 1) of the factory interface 105 and/or the on-board metrology housing 133 to improve mechanical stability of the spectrograph 428 and the light source 424, which in turn improves signal stability. Each fiber-optic bundle 426 may include one or more fiber-optic cables 429. Each fiber-optic cable 429 may have an inside diameter of about 200 microns, which increases signal intensity and improves alignment sensitivity when compared to fiber-optic cable having a smaller inside diameter. With 200 micron fiber-optic cables, chromatic signal drift is insignificant. It should be contemplated that even though six fiber-optic bundles 426 are shown, more or less fiber-optic bundles 426 may be used according to process requirement.

In one implementation as shown, each fiber-optic bundle 426 includes two fiber-optic cables 429 each having an inside diameter of about 200 microns, one for source signal (from light source 424 to the substrate) and one for receiving signal (reflected from the substrate), which enables single point for maximum intensity and ensures insensitivity of light injected into the fiber-optic cable regardless of the locking orientation with the light source 424. Some of the one or more fiber-optic bundles 426 may be optically connected to the light source 424, and some of the one or more fiber-optic bundles 426 may be optically connected to the spectrograph 428. The on-board metrology assembly 135 may also include a fiber-optic cable mount 404 that may be placed between the first end and the second end. Each fiber-optic bundle 426 is arranged to transmit light from the light source 424 towards a measuring point on the substrate (not shown) at normal incidence. The fiber-optic bundle 426 then captures reflection of the light from the substrate at normal incidence and then transmits that reflection towards the spectrograph 428. Each fiber-optic bundle 426 is coupled to a collimator 434 to collimate the light from the light source 424 to illuminate about, for example, 2 mm in diameter at the measuring point. In one implementation as shown, six fiber-optic bundles 426 (i.e., fiber-optic bundles 426a-f, which are better seen in FIG. 4B) are each coupled to a respective collimator 434a-f. This configuration may be advantageous if two processing chambers are used to share one light source and one spectrograph. In such a case, each processing chamber may include one processing region in which three fiber-optic bundles and three collimators are used. While six collimators are shown in FIG. 4A, it is contemplated that more or less collimators may be used according to the configuration of the processing chamber and process requirement.

The light source 424 may be a flash light source capable of dispersing pulsed light at short durations. The light source 424 may be a white light source. In one implementation, the light source 424 may be a Xenon flash-lamp. The light source 424 may include a diffuser so the light generated is distributed homogeneously through multiple fiber-optic bundles, such as the fiber-optic bundles 426 and a reference fiber-optic bundle (not shown). The reference fiber-optic bundle may be connected between the light source 424 and the spectrograph 428 to provide a reference channel to cancel out flash-to-flash variations or to compensate any fluctuations/drifts overtime of the light source 424. The spectrograph 428 may include a charged-coupled device (CCD) array light detector. In one implementation, the spectrograph 428 may measure unpolarized light with a wavelength range between about 200 nm and about 2500 nm, such as between about 200 nm and about 800 nm. In some implementations, the light source 424 may produce ultraviolet (UV) light. In some implementations, light source producing light having more deep ultraviolet (DUV) content may be used. Examples of the light source for producing light having more DUV content are plasma driven light sources or lasers. In some implementation, light having wavelength in infrared range (IR) may be used.

Figure 4B:
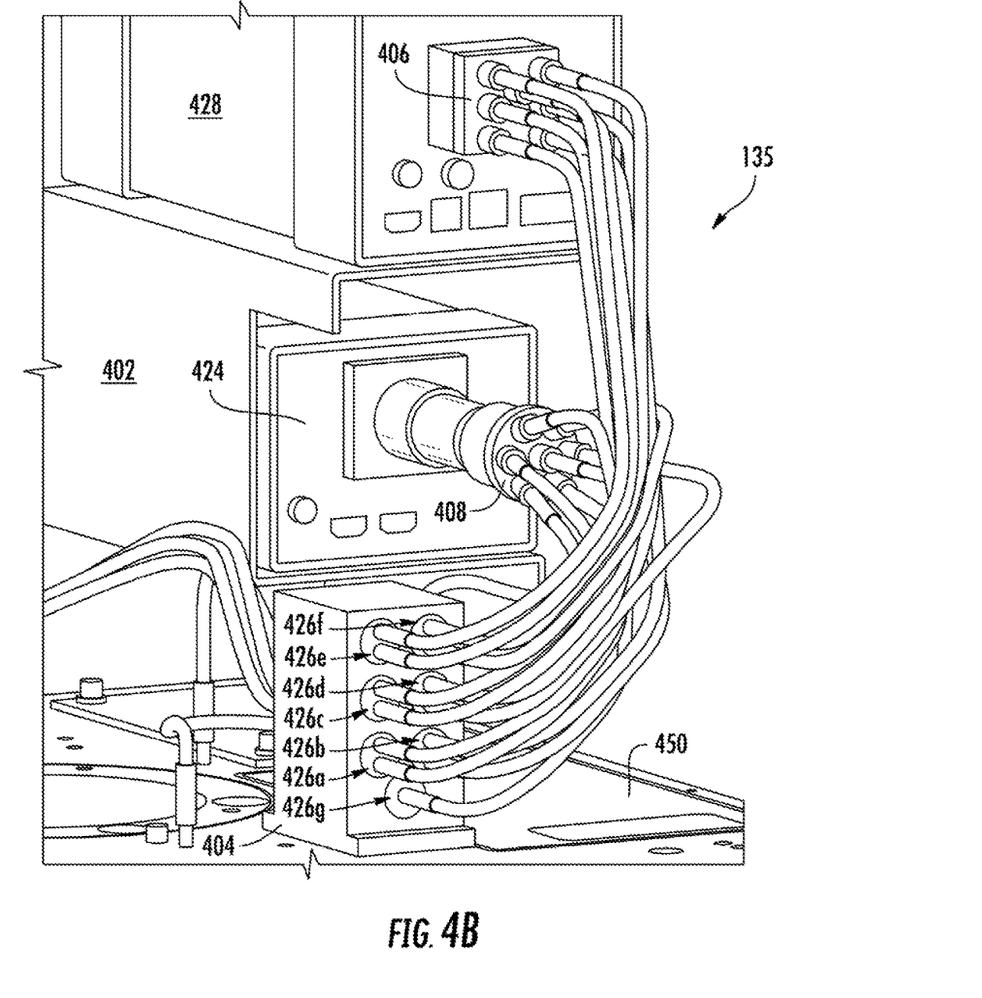
FIG. 4B illustrates an enlarged view of a portion of the on-board metrology assembly of FIG. 4A according to implementations described herein.

FIG. 4B illustrates an enlarged view of a portion of the on-board metrology assembly 135 of FIG. 4A according to implementations described herein. As shown in FIG. 4B, the light source 424 and the spectrograph 428 are secured to the mounting bracket 450 by the supporting frame 402 in order to improve mechanical stability of the spectrograph 428 and the light source 424. A fiber SMA retainer 406 may be coupled to the spectrograph 428 for tightly retaining the fiber-optic bundles 426 in order to improve signal stability. Without the fiber SMA retainer 406, the fiber-optic bundles 426 are vulnerable to be loosened due to tool vibration, manual touch and other interferences. Similarly, a fiber SMA retainer 408 may be coupled to the light source 424. Fiber SMA retainers 406, 408 on the spectrograph 428 and the light source 424, respectively, help improve signal stability. A fiber-optic cable mount 404 may be disposed on the mounting bracket 450 for securing the fiber-optic bundles 426 and the reference fiber-optic bundle 440. As shown in FIG. 4B, there are six fiber-optic bundles 426a-f and one reference fiber-optic bundle 426g coupled to the light source 424, and six fiber-optic bundles 426a-f and one reference fiber-optic bundle 426g coupled to the spectrograph 428.

Figure 5A:
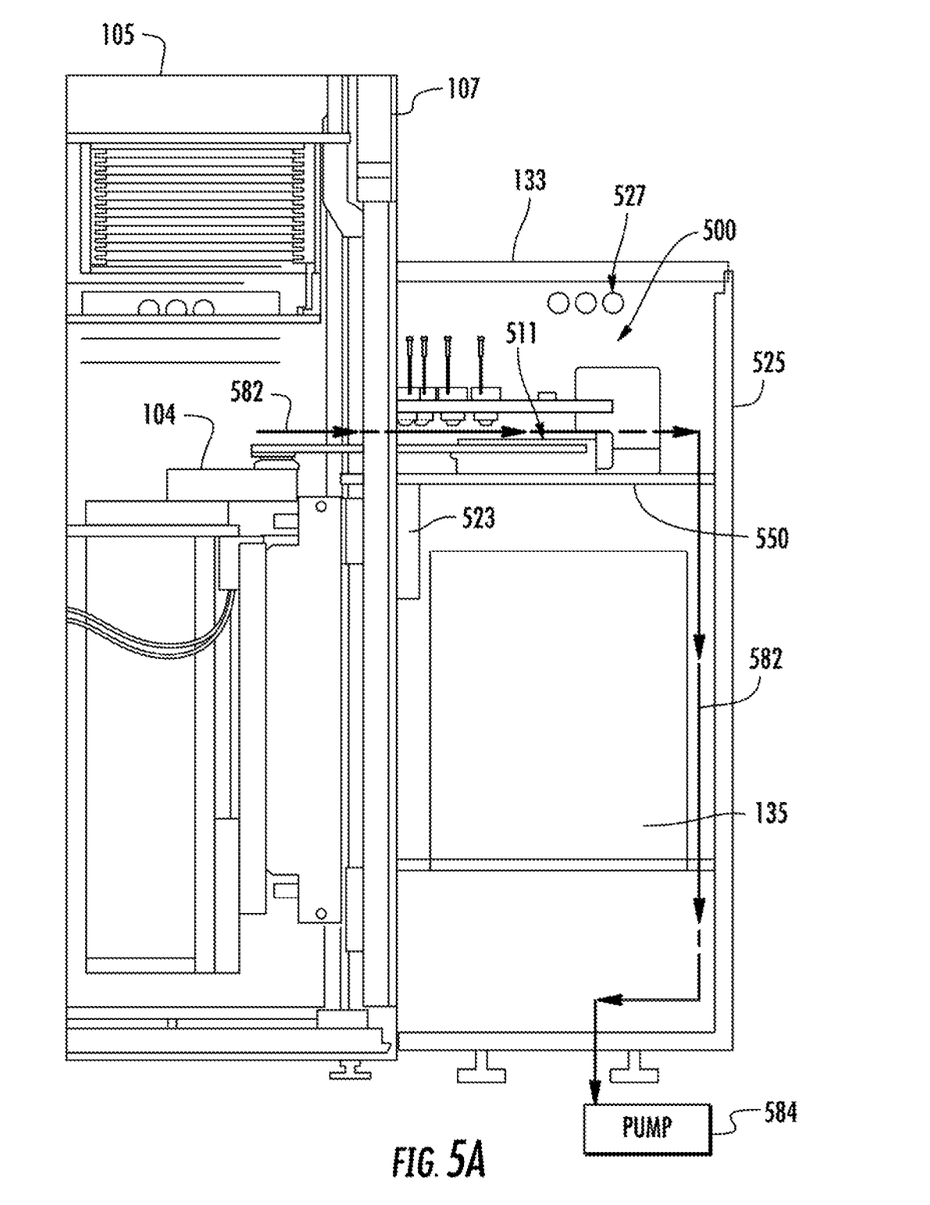
FIG. 5A illustrates a cross-sectional view of an exemplary set up of an on-board metrology assembly disposed in the on-board metrology housing of FIG. 1.
Figure 5B:
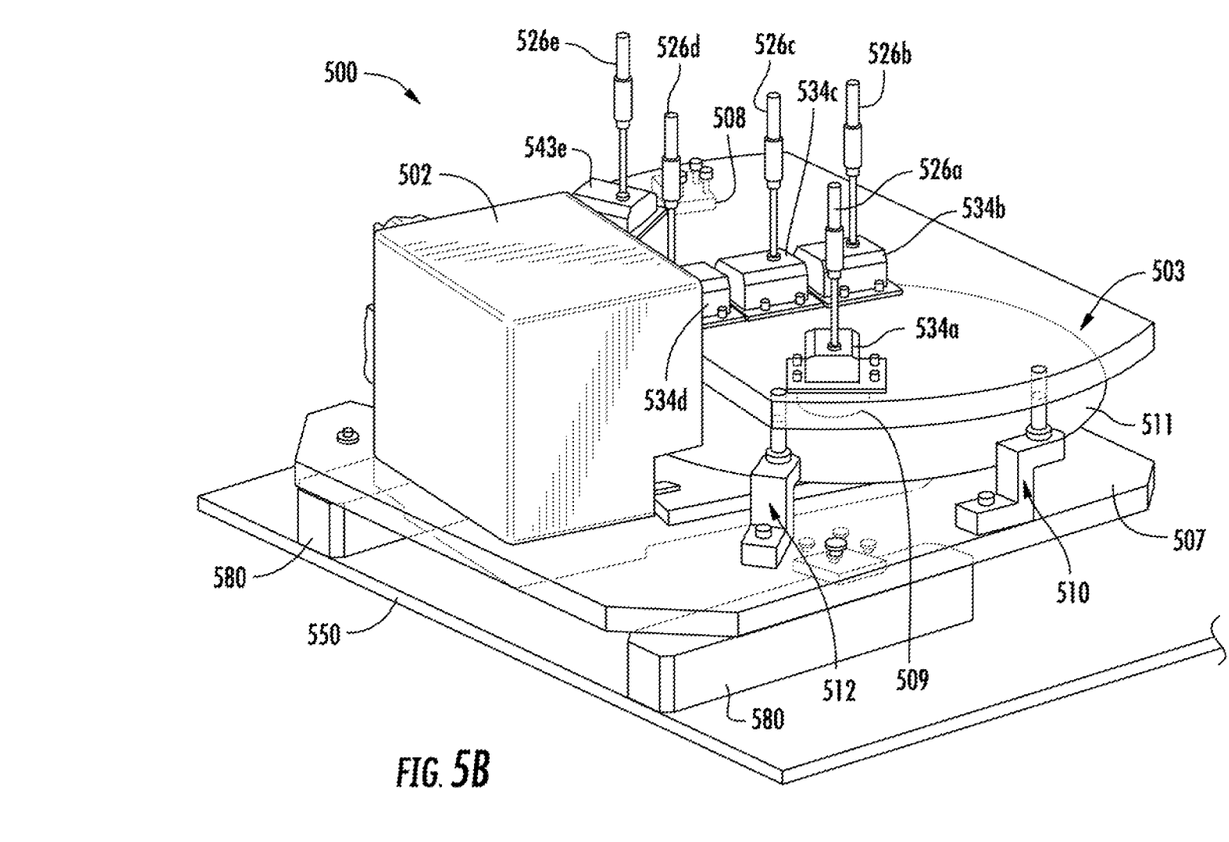
FIG. 5B illustrates a perspective view of an aligner module of the on-board metrology assembly according to one implementation of the present disclosure.

FIG. 5A illustrates a cross-sectional view of an exemplary set up of an on-board metrology assembly 135 disposed in the on-board metrology housing 133 of FIG. 1 according to one implementation of the present disclosure. FIG. 5B illustrates a perspective view of an aligner module 500 of the on-board metrology assembly 135 according to one implementation of the present disclosure.

The aligner module 500 generally includes collimators 534a-534e and fiber-optic bundles 526a-526e. The aligner module 500 of the on-board metrology assembly 135 is disposed on a mounting bracket 550. The mounting bracket 550 is supported by one or more rigid support brackets 523 once the on-board metrology housing 133 is engaged with the wall 107 of the factory interface 105. The one or more rigid support brackets 523 are mounted onto a reference datum plate 602 (see FIG. 6A) disposed on the wall 107 of the factory interface 105. The casing of the on-board metrology housing 133 may be perforated 527 for ventilation purposes. The aligner module 500 of the on-board metrology assembly 135 is disposed at a height corresponding to the movement of the robot blade 104 to allow transfer of the substrates in and out of the on-board metrology housing 133 without interference with the collimators. Other parts of the on-board metrology assembly 135, such as the light source 424, fiber-optic bundles 426 and the spectrograph 428 shown in FIGS. 4A and 4B, may be positioned in a region below the mounting bracket 550. Electronics for the on-board metrology assembly 135, such as AC box, may also be positioned below the mounting bracket 550.

The on-board metrology housing 133 has a door 525 to allow access and service of the on-board metrology assembly 135 and the electronics. The on-board metrology assembly 135 and the aligner module 500 are removable and can be horizontally slid into the on-board metrology housing 133 using any suitable mechanism such as a rack.

Referring now to FIG. 5B, the aligner module 500 may have a supporting frame 502 disposed on the mounting bracket 550. The aligner module 500 has an aligner plate 507 extending radially from the bottom of the supporting frame 502. The aligner plate 507 has its back side supported by a supporting block 580, which is mounted to the mounting bracket 550. The mounting bracket 550 is supported by one or more rigid support brackets 523 (see FIGS. 5A and 6B) once the on-board metrology housing 133 is engaged with the wall 107 of the factory interface 105, as discussed above. The aligner plate 507 has an aligning mechanism 509 for rotating a substrate 511. FIG. 5D illustrates a perspective view of the aligning mechanism 509 disposed on the aligner plate 507. During operation, the atmospheric robot 104 in the factory interface 105 picks up a substrate from an atmospheric holding station and places it on the aligning mechanism 509 within the on-board metrology housing 133. The substrate 511 is then rotated by the aligning mechanism 509 to allow thickness measurement on various points along the radii of the substrate using the aligner module 500.

The aligner module 500 generally includes a plurality of fiber-optic bundles 526a, 526b, 526c, 526d, and 526e and collimators 534a, 534b, 534c, 534d, and 534e. Each of the fiber-optic bundles 526a-526e is coupled to a corresponding collimator 534a-534e, respectively. The collimators 534a-534e and fiber-optic bundles 526a-526e are also in electrical communication with the light source 424, fiber-optic bundles 426 and the spectrograph 428 shown in FIG. 4A in order to transmit measurement data. The collimators 534a, 534b, 534c, 534d, and 534e are mounted on an adapter plate 503 at predetermined locations. In one implementation as shown, the collimator 534b is disposed at the center of the aligner plate 507 so that its sensor is focused at the center of the substrate 511. The other four collimators 534a, 534c, 534d, and 534e may be disposed at locations corresponding to four different radial regions of the substrate, for example, R 49.33 mm, R 98.67 mm, R 147 mm, and R 148 mm, to measure film thickness at those positions. Different radii are contemplated, depending on the process requirement and/or the size of the substrate. The substrate can be rotated by any angle to measure thickness of various points along the radii and thus to map for film thickness on the substrate. In one implementation as shown, the collimators 534b, 534c, and 534d are aligned along the radius of the adapter plate 503. It is contemplated that more or less collimators are contemplated. In one implementation, only four collimators (selected from any of collimators 534a, 534b, 534c, 534d, and 534e) are used in the on-board metrology assembly 135.

The adapter plate 503 may be supported by the aligner plate 507 through a leveling stud/nut 508, 510, 512. The leveling stud/nut 508, 510, 512 can be any suitable mechanism, such as a spherical bearing, for leveling the adapter plate. The leveling stud/nut 508, 510, 512 are configured to independently adjust vertical and/or horizontal leveling of the adapter plate 503 with respect to mounting bracket 550 at different locations. The adapter plate 503 may be leveled for parallelism with the mounting bracket 550 using the leveling stud/nut 508, 510, and 512. Three point leveling mechanism may be advantageous since there is no interference with the robot blade, such as the atmospheric robot 104 shown in FIGS. 1 and 5A.

Figure 5C:
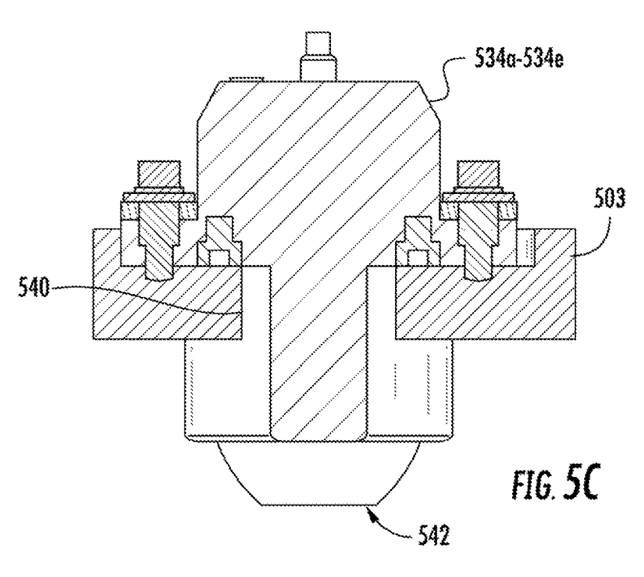
FIG. 5C illustrates a cross-sectional view of the collimators extending through a corresponding opening formed in an adapter plate.
Figure 5D:
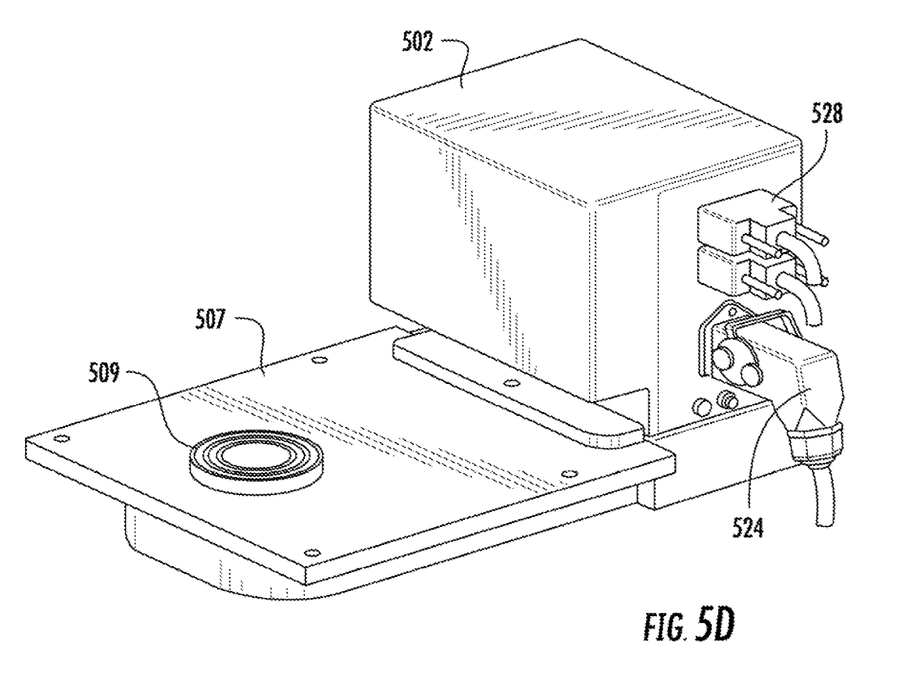
FIG. 5D illustrates a perspective view of an aligner plate having an aligning mechanism.

Each of the collimators 534a-534e may extend through a corresponding opening 540 formed in the adapter plate 503, as shown in FIG. 5C. The opening 540 may be slightly wider than the width of the collimators 534 so the collimators can tolerate slight misalignment when placing the collimators into the opening 540.

While not shown, an exhaust duct/channel with perforated sheets may be provided inside the on-board metrology housing 133 so that compressed air from the factory interface 105 enters and leaves the on-board metrology housing 133 smoothly without recirculation. For example, the exhaust duct/channel may be provided at locations near the mounting bracket 550 and/or along the on-board metrology housing 133. The exhaust duct/channel is provided such that a laminar flow 582 is introduced from the factory interface 105 into the on-board metrology housing 133. The laminar flow 582 is maintained above the substrate 511 so that no particles are accumulated on the substrate which can affect the measurement and/or final chip. By maintaining laminar flow inside the on-board metrology housing 133, any out-gassing from the substrate 511 can be exhausted, thereby preventing degradation of the collimators 534a-534e (FIG. 5B). The laminar flow 582 is then pumped out of the on-board metrology housing 133 through a pump 584. It is contemplated that the laminar flow 582 may include any suitable inert gas, such as argon or helium.

Figure 6A:
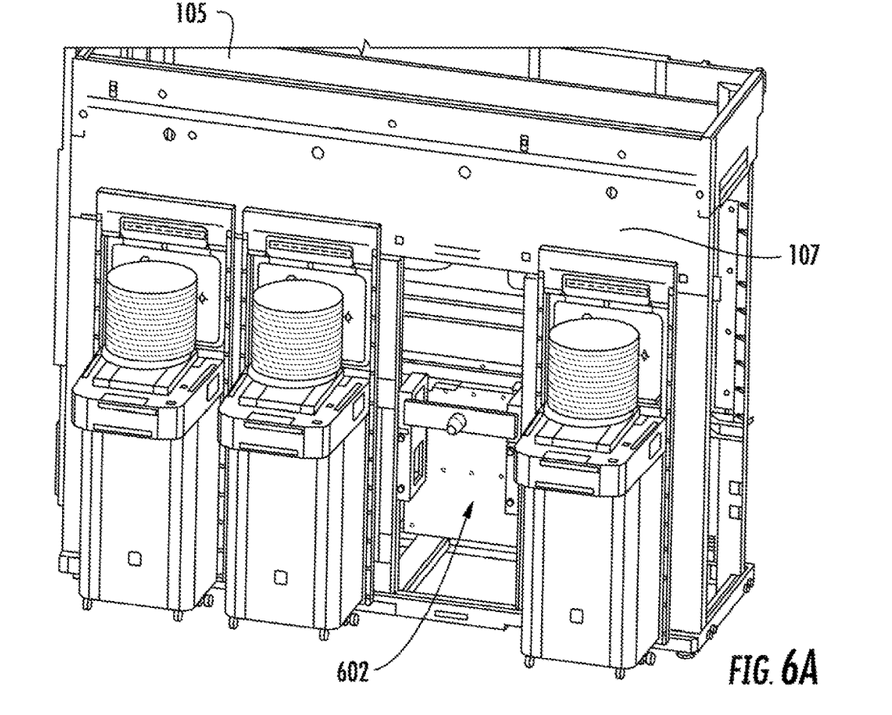
FIG. 6A illustrates a perspective view of a wall of the factory interface prior to engaging with the on-board metrology housing.

For assembling the on-board metrology housing 133 with the factory interface 105, a mechanism, such as the support brackets 523, can be used to align the on-board metrology housing 133 precisely with respect to the factory interface 105. The mechanism is capable of locating the on-board metrology housing 133 onto the wall 107 with same precision every time. FIG. 6A illustrates a perspective view of the wall 107 of the factory interface 105 prior to engaging with the on-board metrology housing 133. The wall 107 is provided with a reference datum plate 602. The one or more rigid support brackets 523 are mounted onto the reference datum plate 602.

Figure 6B:
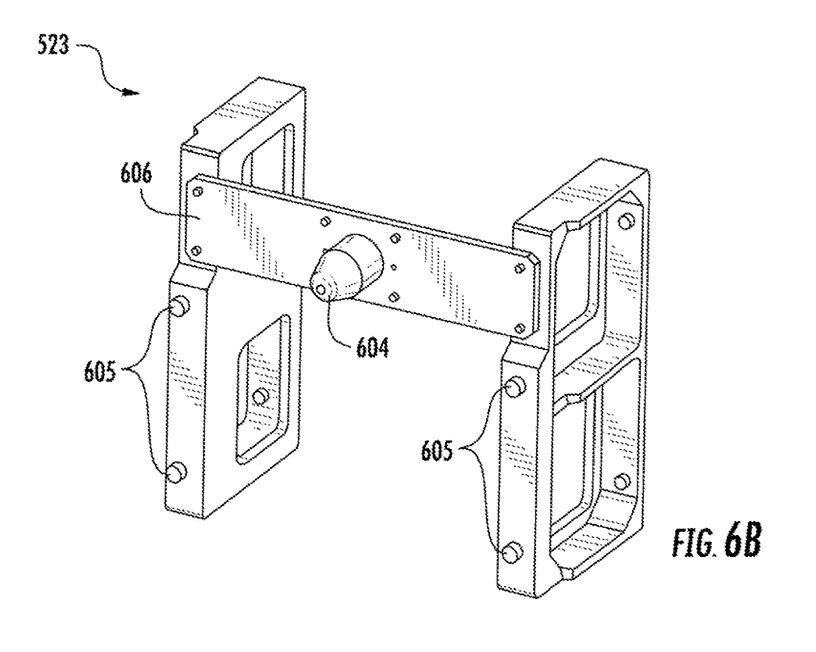
FIG. 6B illustrates a perspective view of support brackets according to one implementation of the present disclosure.

FIG. 6B illustrates a perspective view of the support brackets 523 according to one implementation of the present disclosure. The one or more support brackets 523 may be connected to each other through a plate 606. The plate 606 may have one or more pins 604 (only one is shown) arranged to allow an operator to push the on-board metrology housing 133 towards the factory interface 105 with a desired precision. The support brackets 523 may also have two or more aligning mechanisms 605 for holding the on-board metrology housing 133 rigidly once it is engaged with the wall 107.

Figure 6C:
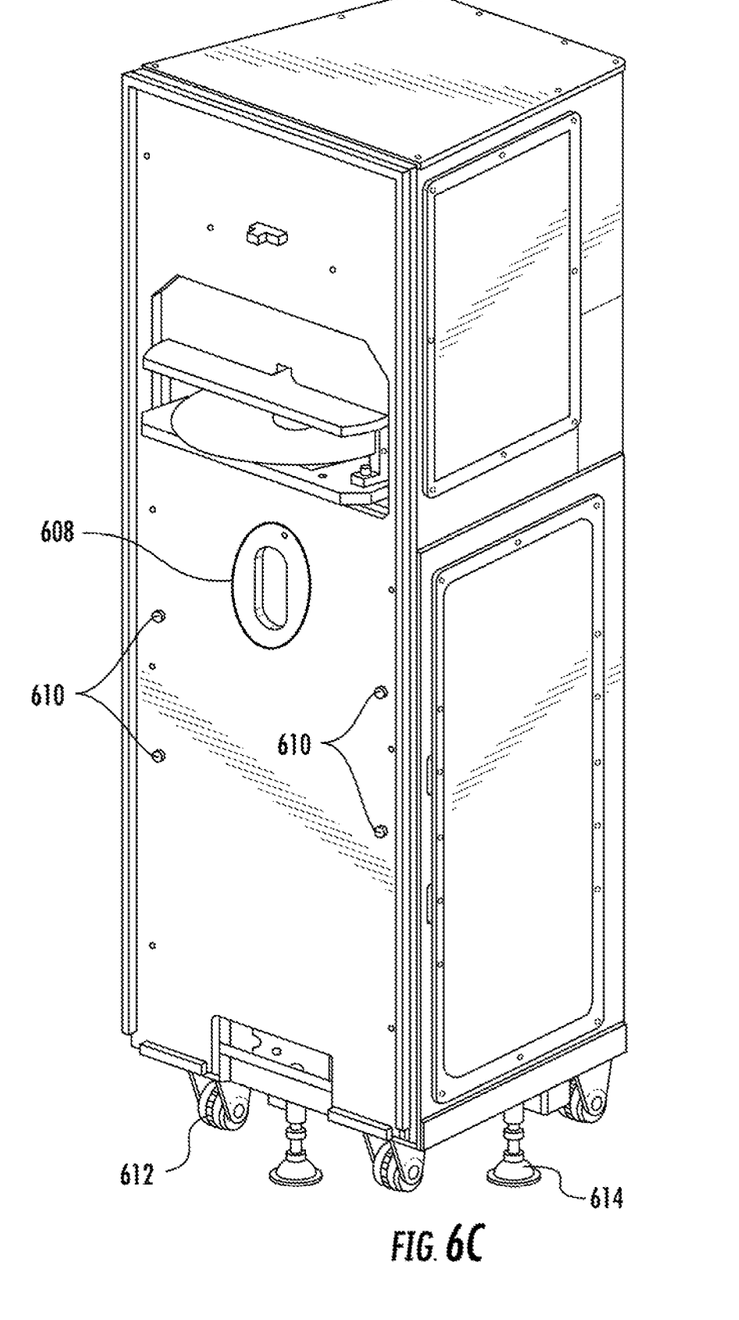
FIG. 6C illustrates a perspective view of an on-board metrology housing showing the back side of the on-board metrology housing.

FIG. 6C illustrates a perspective view of the on-board metrology housing 133 showing the back side. The back side (i.e., the side facing the reference datum plate 602) of the on-board metrology housing 133 may have one or more slots 608 (only one is shown) that are sized to allow passage of the pin(s) 604. The on-board metrology housing 133 may also have one or more mating locations 610 for receiving the aligning mechanisms 605 of the support brackets 523, thereby assembling the on-board metrology assembly 135 with the wall 107 of the factory interface 105. The vertical slots 608 and the mating locations 610 are provided to ensure ease of assembly by one single operator. The on-board metrology housing 133 may also include three or more castor wheels 612 to prevent rotation of the on-board metrology housing 133 about horizontal axes while the operator is assembling and/or aligning the on-board metrology housing 133 with the factory interface 105. If desired, one or more leveling feet 614 may be disposed at the bottom of the on-board metrology housing 133 to raise or lower the on-board metrology housing 133. Once the on-board metrology housing 133 is aligned and pushed by the operator, it rests against the support brackets 523.

In operation, a robot blade (e.g., the atmospheric robot 104 shown in FIG. 1) may move the substrate from the atmospheric holding station 109 to the on-board metrology housing 133 containing the on-board metrology assembly 500. The light source may be turned on for about 60 seconds prior to stabilize the light signal from the light source. Alternatively, the light source may be always on to measure film thickness at times until the end of the thickness measurement. The robot blade places the substrate onto the aligning mechanism 509 where the substrate is rotated to find an alignment marking, such as an alignment notch, on the substrate to allow the substrate to be appropriately oriented within the on-board metrology housing 133 and get ready for measurement. The term orientation or orientation of the substrate refers to a rotational position of the substrate about a central axis of symmetry of the substrate.

Once the alignment marking is identified and the substrate is stabilized, the pre-turned on light source distributes light homogeneously through the fiber-optic cables to the fiber-optic bundles 426a-426f and the fiber-optic bundle 526a-526e, and then to the collimators 534a-534e to illuminate the substrate surface for measurement. The fiber-optic cables collect reflected signal from the substrate surface by collimating broadband light in the range of 200-800 nm. During the operation for thickness measurement, the substrate may be illuminated for about 1.5 seconds. The substrate is then rotated by the aligning mechanism 509 counterclockwise or clockwise to perform next measurement on the substrate. In one implementation, six independent measurements are performed by rotating the substrate 60° for each measurement until a 360° rotation of the substrate is completed. For substrate stability, there may be a predetermined waiting period (based on vibrational information and tool test) after each rotation and before the next measurement is performed.

If desired, background signals may be collected for all collimators for a period of time, such as about 10 seconds, to obtain an averaged wavelength-dependent background signal per collimator. In some implementations where the bare silicon substrate calibration is desired, bare silicon substrate signals may be collected to calibrate all collimator. The reflected signal from bare silicon substrate may be collected for a period of time, such as about 30 seconds, in order to obtain an averaged wavelength-dependent signal per collimator. This calibration can be extended to number of rotation, corresponding to target substrate thickness rotation, for each collimator, excluding the one at the center of the aligner plate 507, in order to cancel out any potential error due to wobbliness of the substrate with rotation. Based on known bare silicon properties, reflectance of the target processed substrate can then be measured and used for film thickness calculation. In some implementations, the substrate at any of the FOUPs 102 (FIG. 1) can be transferred onto the aligning mechanism 509 within the on-board metrology housing 133 to collect reflected signal and measured thickness.

The collection of reflected signal and corresponding measurement of thickness for a particular orientation of the substrate may continue for a period of time, such as about 1.5 seconds for 15 data-points of thickness, in order to obtain an averaged thickness of the film using either all data-points or desired number of data-points for that particular location on wafer. The substrate then may be rotated by any desired angle, such as 60 degrees, for the thickness measurement on the next locations. Signal collection and thickness measurement may be stopped for the period while the target substrate rotates and stabilizes. The rotation of the target substrate and measurement may be continued until the desired numbers of rotation, such as 5 rotations, are completed and the corresponding thicknesses are obtained. A film thickness map on the substrate may be generated using the thickness measured through all these rotations Once the measurement is finished, the substrate is transferred by the atmospheric robot 104 from the on-board metrology housing 133 back to the atmospheric holding station 109, and then to the load port of the pair of FOUPs 102 (FIG. 1). This measurement procedure may be repeated on the next substrate received in the on-board metrology housing 133 until all or a desired number of substrates are processed. Measurement and analysis of reflectance of the film may be conducted simultaneously in a server where the thickness information, film morphology, and/or other parameters of the film are monitored in real time. The measurement data are analyzed to determine if there is a system fault that causes the thickness uniformity to drift. Once the fault is identified, the processing tool can be set up to prevent further substrate processing until the source(s) of fault is identified or corrected. The substrate is then proceeded with the process using tuned conditions to tune thickness uniformity.

The on-board metrology assemble 135 and the aligner module 500 reduce chromatic signal drift to the point that the resulting drift of measured thickness is insignificant. The thickness drift for continuous measurement using the on-board metrology assemble 135 and the aligner module 500 after deposition is almost negligible. The on-board metrology assemble 135 and the aligner module 500 are robust and are capable of measuring thickness with high accuracy (sub-angstrom level).

While the foregoing is directed to implementations of the present disclosure, other and further implementations of the disclosure may be devised without departing from the basic scope thereof.

The invention claimed is:
1. An apparatus, comprising:
a factory interface;
a first storage pod coupled to a first side of the factory interface through a first load port, and the first storage pod comprises one or more substrate carriers;
a metrology housing removably coupled to the first side of the factory interface through a second load port, the metrology housing comprises an on-board metrology assembly for measuring film properties of a substrate to be transferred into the metrology housing, and the on-board metrology comprises an aligner plate that is operable to rotate the substrate; and a load lock chamber coupled to a second side of the factory interface and operating at vacuum environment, wherein the factory interface has a robot configured to provide access to the metrology housing and the load lock chamber.

2. The apparatus of claim 1, wherein the on-board metrology assembly comprises:
   a light source;
   a spectrograph;
   a supporting frame securing the light source and the spectrograph;
   a first set of fiber-optic bundles optically connected to the light source and the spectrograph; and
   a first set of collimators coupled to the first set of fiber-optic bundles.

3. An apparatus, comprising:
   a factory interface;
   a first storage pod coupled to a first side of the factory interface through a first load port, and the first storage pod comprises one or more substrate carriers;
   a metrology housing removably coupled to the first side of the factory interface through a second load port, the metrology housing comprises an on-board metrology assembly for measuring film properties of a substrate to be transferred into the metrology housing; and
   a load lock chamber coupled to a second side of the factory interface, wherein the second side is opposed to the first side, and the factory interface has a robot configured to provide access to the metrology housing and the load lock chamber,
   wherein the on-board metrology assembly comprises:
      a light source;
      a spectrograph;
      a supporting frame securing the light source and the spectrograph;
      a first set of fiber-optic bundles optically connected to the light source and the spectrograph;
      a first set of collimators coupled to the first set of fiber-optic bundles; and
      an aligner module, the aligner module comprising:
         an aligner plate having a rotating mechanism;
         a second set of fiber-optic bundles in electrical communication with the first set of fiber-optic bundles; and
         a second set of collimators in electrical communication with the first set of collimators, wherein the second set of fiber-optic bundles is coupled to the second set of collimators.

4. The apparatus of claim 3, wherein the aligner module is disposed on a mounting bracket, and the mounting bracket is supported by one or more support brackets.

5. The apparatus of claim 4, wherein the one or more support brackets are mounted onto a reference datum plate disposed on a wall of the factory interface.

6. The apparatus of claim 5, wherein the support brackets are connected to each other through a plate, and the plate having one or more guiding pins.

7. The apparatus of claim 6, wherein the metrology housing has a slot on a back side of the metrology housing to allow passage of the one or more guiding pins.

8. The apparatus of claim 4, wherein the on-board metrology assembly further comprising an adapter plate, wherein the second set of collimators is mounted on the adapter plate.

9. The apparatus of claim 8, wherein a first collimator of the second set of collimators is disposed at the center of the aligner plate.

10. The apparatus of claim 9, wherein a second collimator, a third collimator, a fourth collimator, and a fifth collimator of the second set of collimators are disposed at locations corresponding to four different radial regions of a substrate to be transferred into the metrology housing.

11. The apparatus of claim 8, wherein the adapter plate is supported by the aligner plate through a plurality of leveling components configured to independently adjust horizontal leveling of the adapter plate with respect to the mounting bracket.

12. A processing tool, comprising:
    a transfer chamber having a robotic arm;
    a factory interface having an atmospheric robot, wherein the factory interface further comprises:
       a reference datum plate disposed on a wall of the factory interface on the second side; and
       one or more support brackets mounted onto the reference datum plate, the one or more support brackets have at least a guiding pin;
    a batch curing chamber coupled to the factory interface;
    a load lock chamber having a first side coupling to the transfer chamber and a second side coupling to a first side of the factory interface, the load lock chamber is configured to receive one or more substrates from the atmospheric robot;
    a flowable CVD deposition chamber coupled to the transfer chamber;
    a first storage pod coupled to a second side of the factory interface through a first load port, and the first storage pod comprises one or more substrate carriers; and
    an metrology housing coupled to the second side of the factory interface through a second load port, the metrology housing comprises an on-board metrology assembly for measuring film properties of a substrate to be transferred into the metrology housing by the atmospheric robot.

13. The processing tool of claim 12, wherein the metrology housing comprises a door disposed on a first side of the metrology housing and a slot disposed on a second side of the metrology housing, the second side opposing the first side, and the slot is sized to allow passage of the guiding pin.

14. The processing tool of claim 12, wherein the on-board metrology assembly comprises an aligner plate having a rotating mechanism, and the rotating mechanism supports and rotates the substrate.

* * * * *